United States Patent
Jeon et al.

(10) Patent No.: US 8,373,200 B2
(45) Date of Patent: Feb. 12, 2013

(54) NITRIDE BASED SEMICONDUCTOR DEVICE AND METHOD FOR MANUFACTURING OF THE SAME

(75) Inventors: Woo Chul Jeon, Gyeonggi-do (KR); Ki Yeol Park, Gyeonggi-do (KR); Young Hwan Park, Seoul (KR); Jung Hee Lee, Daegu-si (KR)

(73) Assignee: Samsung Electro-Mechanics Co., Ltd., Suwon (KR)

( * ) Notice: Subject to any disclaimer, the term of this patent is extended or adjusted under 35 U.S.C. 154(b) by 134 days.

(21) Appl. No.: 12/842,303

(22) Filed: Jul. 23, 2010

(65) Prior Publication Data
US 2011/0254057 A1     Oct. 20, 2011

(30) Foreign Application Priority Data

Apr. 14, 2010    (KR) .................. 10-2010-0034373

(51) Int. Cl.
*H01L 29/739*    (2006.01)
(52) U.S. Cl. .................. 257/201; 257/615; 257/E21.09; 257/E29.091; 438/478
(58) Field of Classification Search .................. 257/201, 257/615, E21.09, E29.091; 438/478
See application file for complete search history.

(56) References Cited

U.S. PATENT DOCUMENTS

| 7,459,356 B1 | 12/2008 | Smart et al. |
| 7,898,004 B2 * | 3/2011 | Wu et al. ................ 257/194 |
| 2011/0233519 A1 * | 9/2011 | Cheng et al. ................ 257/15 |

FOREIGN PATENT DOCUMENTS

| JP | 2005-005657 | 1/2005 |
| KR | 10-2007-0092482 A | 9/2007 |
| KR | 10-2010-0034919 A | 4/2010 |

OTHER PUBLICATIONS

Korean Notice of Allowance issued in Korean Application No. 10-2010-0034373 issued on Jun. 23, 2012.

* cited by examiner

*Primary Examiner* — David Vu
*Assistant Examiner* — Brandon Fox
(74) *Attorney, Agent, or Firm* — McDermott Will & Emery LLP

(57) ABSTRACT

Disclosed herein is a nitride based semiconductor device. The nitride based semiconductor device includes: a base substrate; an epitaxial growth layer disposed on the base substrate and having a defect generated due to lattice disparity with the base substrate; a leakage current barrier covering the epitaxial growth layer while filling the defect; and an electrode part disposed on the epitaxial growth layer.

10 Claims, 4 Drawing Sheets

NITRIDE BASED SEMICONDUCTOR DEVICE AND METHOD FOR MANUFACTURING OF THE SAME

CROSS REFERENCE TO RELATED APPLICATION

This application claims the benefit of Korean Patent Application No. 10-2010-0034373, filed on Apr. 14, 2010, entitled "Nitride Based Semiconductor Device And Method For Manufacturing The Same", which is hereby incorporated by reference in its entirety into this application.

BACKGROUND OF THE INVENTION

1. Technical Field

The present invention relates to a semiconductor device and a method for manufacturing the same, and more particularly, to a nitride based semiconductor device reducing leakage current and a method for manufacturing the same.

2. Description of the Related Art

In general, III-nitride based semiconductors including III-group elements such as gallium (Ga), aluminum (Al), and indium (In) and nitrogen (N) have characteristics such as a wide energy band gap, high electron mobility and saturated electron speed, and high thermal chemical stability. A nitride-based field effect transistor (N-FET) based on the III-nitride based semiconductors is manufactured based on semiconductor materials having wide energy band gap, for example, materials such as gallium nitride (GaN), aluminum gallium nitride (AlGaN), indium gallium nitride (InGaN), aluminum indium gallium nitride (AlInGaN), etc.

The general nitride-based field effect transistor has a so-called high electron mobility transistor (hereinafter, referred to as 'HEMT') structure. For example, a semiconductor device having the HMET structure includes a base substrate, an epitaxial growth layer formed on the base substrate, and a Schottky electrode and an ohmic electrode disposed on the semiconductor layer. The nitride based semiconductor device generates 2-dimensional electron gas (2-DEG) used as a movement path of current in the semiconductor layer and may perform forward and reverse operations by using the 2-DEG as a carrier movement path.

Meanwhile, the epitaxial growth layer is formed by performing an epitaxial growth process by using the base substrate as a seed layer. For example, by using a sapphire substrate as the base substrate and performing the epitaxial growth process with respect to the sapphire substrate, a gallium nitride layer and an aluminum gallium nitride layer may be formed on the sapphire substrate. As a result, the base substrate and the epitaxial growth layer have a heterogeneous bonding structure in which different kinds of layers are bonded with each other.

However, the base substrate and the epitaxial growth layer made of heterogeneous materials have a large difference in lattice constant and thermal expansion coefficient. Therefore, many lattice defects are generated on the epitaxial growth layer due to lattice disparity between the base substrate and the epitaxial growth layer while the epitaxial grown layer is formed. In particular, the lattice defects of the epitaxial growth layer in the nitride based semiconductor device are larger in size and markedly more in the number per unit area than defects generated on the epitaxial growth layer on a silicon substrate of a silicon semiconductor device. For example, the silicon semiconductor device, in which silicon layers are grown on the silicon substrate, has a structure in which materials of the same kind of seed layer are epitaxially grown. As such, the defects of the epitaxial growth layer of the silicon semiconductor device are generated due to lattice disparity between heterogeneous materials, while defects on the silicon substrate are just transferred to the epitaxial growth layer, such that the defects of the silicon semiconductor device are generated. Contrary to this, the nitride based semiconductor device, in which a nitride layer is grown on the sapphire substrate, has a structure in which materials of a different kind from the seed layer are epitaxially grown. Most defects of the epitaxial growth layer in the nitride based semiconductor device are the defects generated due to the lattice disparity between heterogeneous materials. Such defects can be prevented from being generated if the base substrate is made of the same material or similar material as the epitaxial growth layer. Consequently, due to the defects, the production efficiency of the nitride based semiconductor device is deteriorated, leakage current is generated, and breakdown voltage is decreased. In particular, unlike a semiconductor device, in the case of the nitride based semiconductor device, since there is provided a layer where carriers are concentrated, such as the 2-DEG. Therefore, when a metal layer are formed so as to the Schottky and ohmic electrodes in the case in which many defects exist on the epitaxial growth layer, the metal layer enters the defects. In this case, the 2-DEG is electrically conducted through the metal layer in the defects, thus, causing large amounts of leakage current.

SUMMARY OF THE INVENTION

An object of the present invention is to provide a nitride based semiconductor device capable of preventing leakage current from being generated due to defects of an epitaxial growth layer.

Another object of the present invention is to provide a method for manufacturing a nitride based semiconductor device capable of preventing leakage current from being generated due to defects of an epitaxial growth layer.

According to an exemplary embodiment of the present invention, there is provided a nitride based semiconductor device, including: a base substrate; an epitaxial growth layer disposed on the base substrate and having a defect generated due to lattice disparity with the base substrate; a leakage current barrier covering the epitaxial growth layer while filling the defect; and an electrode part disposed on the epitaxial growth layer.

According to an exemplary embodiment of the present invention, the leakage current barrier may include: a first oxide layer covering the epitaxial growth layer; and a second oxide layer extending from the first oxide layer and entering an empty space in the defect.

According to an exemplary embodiment of the present invention, the leakage current barrier may include any one metal oxide layer of an aluminum oxide ($Al_2O_3$) layer, a hafnium oxide ($HfO_3$) layer, a hafnium silicate oxide (HfSiO) layer, a zirconium oxide (ZnO, $ZrO_2$) layer, a titanium oxide ($TiO_2$) layer, a strontium oxide (SrO) layer, a tantalum oxide ($Ta_2O_5$) layer, a rantannyum oxide ($La_2O_3$) layer, and a silicon oxide ($SiO_2$) layer.

According to an exemplary embodiment of the present invention, the leakage current barrier may be formed by performing an automic layer deposition (ALD) process.

According to an exemplary embodiment of the present invention, the epitaxial growth layer may include: a first nitride layer on the base substrate; and a second nitride layer disposed on the first nitride layer and having a wider energy band gap than the first nitride layer, wherein 2-dimensional electron gas (2-DEG) may be generated at an interface between the first nitride layer and the second nitride layer.

According to an exemplary embodiment of the present invention, the electrode part may include a Schottky electrode and an ohmic electrode disposed on the epitaxial growth layer, wherein the Schottky electrode may have a plate shape covered by the leakage current barrier at a central area of the epitaxial growth layer and the ohmic electrode may have a ring shape covering the leakage current barrier at an edge area of the epitaxial growth layer.

According to an exemplary embodiment of the present invention, the leakage current barrier may be used as a surface passivation layer decreasing leakage current of the surface of the epitaxial growth layer.

According to an exemplary embodiment of the present invention, there is provided a method for manufacturing a nitride based semiconductor device, including: preparing a base substrate; forming an epitaxial growth layer on the base substrate by using the base substrate as a seed layer; forming a leakage current barrier covering the epitaxial growth layer while filling a defect of the epitaxial growth layer; and forming an electrode part on the epitaxial growth layer.

According to an exemplary embodiment of the present invention, the forming the leakage current barrier may form at least one metal oxide layer of an aluminum oxide ($Al_2O_3$) layer, a hafnium oxide ($HfO_3$) layer, a hafnium silicate oxide (HfSiO) layer, a zirconium oxide (ZnO, $ZrO_2$) layer, a titanium oxide ($TiO_2$) layer, a strontium oxide (SrO) layer, a tantalum oxide ($Ta_2O_5$) layer, a rantannyum oxide ($La_2O_3$) layer, and a silicon oxide ($SiO_2$) layer.

According to an exemplary embodiment of the present invention, the forming the leakage current barrier may include performing an automic layer deposition (ALD) process.

According to an exemplary embodiment of the present invention, the forming the epitaxial growth layer may include: growing a first nitride layer on the base substrate by using the base substrate as a seed layer; and growing a second nitride layer having a wider energy band gap than the first nitride layer on the first nitride layer by using the first nitride layer as the seed layer, wherein 2-dimensional electron gas (2-DEG) may be generated at an interface between the first nitride layer and the second nitride layer.

According to an exemplary embodiment of the present invention, the forming the electrode part may include: exposing a central area and an edge area of the epitaxial growth layer by removing a part of the leakage current barrier; and forming a metal layer at the exposed central area and edge area.

DESCRIPTION OF THE PREFERRED EMBODIMENTS

Figure 1:
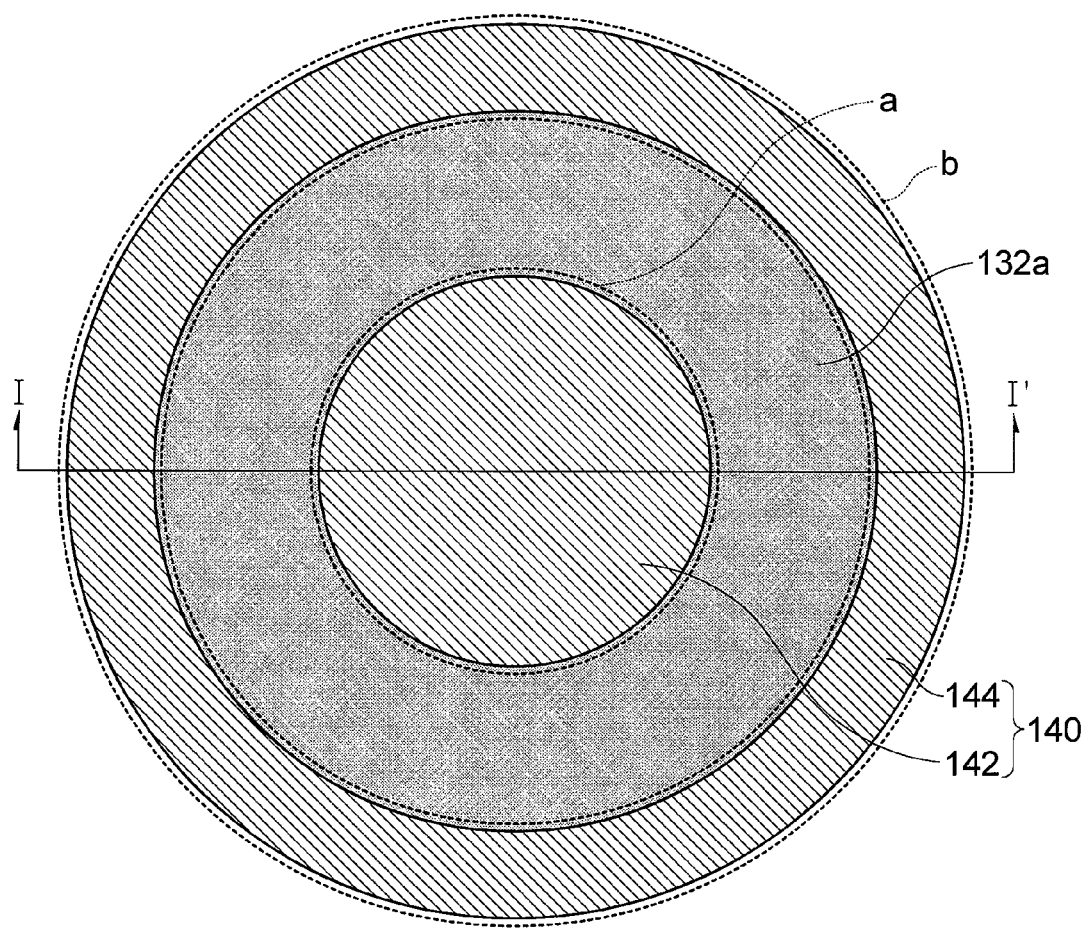
FIG. 1 is a diagram showing a nitride based semiconductor device according to an embodiment of the present invention.

Advantages and characteristics of the present invention, and a method for achieving them will be apparent with reference to embodiments described below in addition to the accompanying drawings. However, the present invention is not limited to the embodiments disclosed below, but may be implemented in various forms. The embodiments may be provided to completely disclose the present invention and allow those skilled in the art to completely know the scope of the present invention. Throughout the specification, like elements refer to like reference numerals.

Terms used in the specification are used to explain the embodiments and not to limit the present invention. In the specification, a singular type may also be used as a plural type unless stated specifically. "Comprises" and/or "comprising" used the specification mentioned constituent members, steps, operations and/or elements do not exclude the existence or addition of one or more other components, steps, operations and/or elements.

Figure 2:
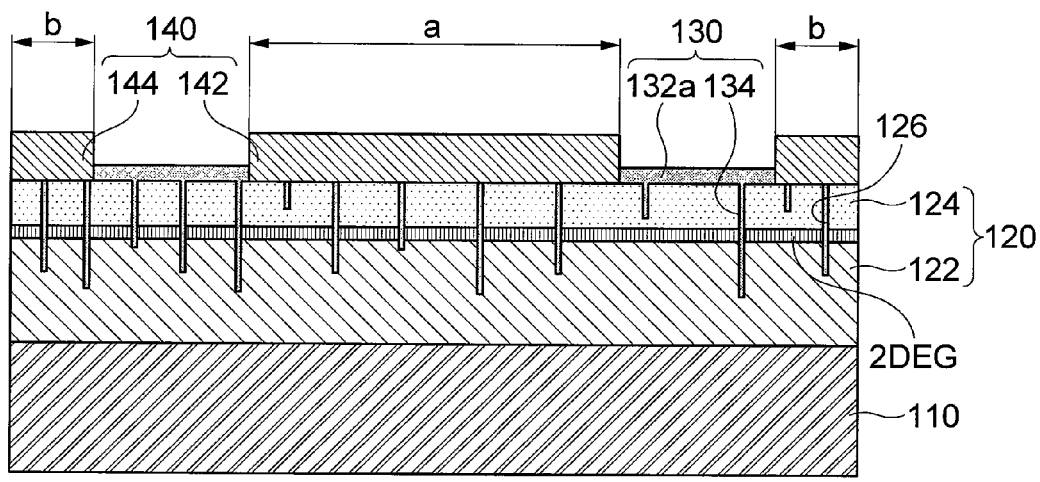
FIG. 2 is a cross-sectional view taken along the line I-I' of FIG. 1.

FIG. 1 is a diagram showing a nitride based semiconductor device according to an embodiment of the present invention and FIG. 2 is a cross-sectional view taken along the line I-I' of FIG. 1.

Referring to FIGS. 1 and 2, the nitride based semiconductor device 100 according to the embodiment of the present invention includes a base substrate 110, an epitaxial growth layer 120m a leakage current barrier 130, and an electrode part 140.

The base substrate 110 may be a plate for forming a nitride based semiconductor device having a high electron mobility transistor (HEMT) structure. For example, the base substrate 110 may be at least one of a silicon substrate, a silicon carbide substrate, and a sapphire substrate.

The epitaxial growth layer 120 may be disposed on the base substrate 110. As one example, the epitaxial growth layer 120 may includes a first nitride layer 122 and a second nitride layer 124 stacked on the base substrate 110 in sequence. The second nitride layer 124 may be made of a material having a wider energy band gap than the first nitride layer 122. The second nitride layer 124 may be made of a material a lattice constant different from the first nitride layer 122. For example, the first nitride layer 122 and the second nitride layer 124 may be layers containing III-nitride based materials. More specifically, the first nitride layer 122 and the second nitride layer 124 may be made of any one selected from gallium nitride (GaN), aluminum gallium nitride (AlGaN), indium gallium nitride (InGaN), and indium aluminum gallium nitride (InAlGaN). As one example, the first nitride layer 122 may be the gallium nitride layer (GaN) and the second nitride layer 124 may be the aluminum gallium nitride (AlGaN).

In the epitaxial growth layer 120 having the above-mentioned structure, 2-dimensional electron gas (2-DEG) may be generated on an interface between the first nitride layer 122 and the second nitride layer 124. Current flows through the 2-dimensional electron gas (2-DEG) when the semiconductor device 100 is actuated.

Meanwhile, the epitaxial growth layer 120 may have a defect 126. For example, when the epitaxial growth layer 120 is formed by performing an epitaxial growth process with respect to the base substrate 110, many lattice defects may be generated on the epitaxial growth layer 120 due to differences in lattice constant and thermal expansion coefficient from the base substrate 110. As one example, the sapphire substrate and the gallium nitride layer are made of materials different from each other and are very large in differences of the lattice constant and the thermal expansion coefficient therebetween. Therefore, when a growth layer such as the gallium nitride layer (GaN) or the aluminum gallium nitride layer (AlGaN) is grown by performing the epitaxial growth process with respect to the sapphire substrate, many lattice defects cannot be prevented from being generated on the epitaxial growth layer. In general, the defect 126 is generated as an empty space in the epitaxial growth layer 120, i.e., a void. The top of the void may have a structure opened to the outside.

The leakage current barrier 130 may serve to solve problems including leakage current generated due to the defect 126, etc. As one example, the leakage current barrier 130 fills the defect 126 of the epitaxial growth layer 120 and may have a structure to cover the epitaxial growth layer 120. As a result, the leakage current barrier 130 may be constituted by a first oxide layer 132a for covering the second nitride layer 124 and a second oxide layer 134 for filling the defect 126. Various kinds of metal oxide layers may be used as the leakage current barrier 130. As one example, the leakage current barrier 130 may include any one of an aluminum oxide ($Al_2O_3$) layer, a hafnium oxide ($HfO_3$) layer, a hafnium silicate oxide (HfSiO) layer, a zirconium oxide (ZnO, $ZrO_2$) layer, a titanium oxide ($TiO_2$) layer, a strontium oxide (SrO) layer, a tantalum oxide ($Ta_2O_5$) layer, a rantannyum oxide ($La_2O_3$) layer, and a silicon oxide ($SiO_2$) layer. The case in which the leakage current barrier 130 is the metal oxide layer is described as an example in the embodiment, but various kinds of insulating materials may be used as the leakage current barrier 130. Therefore, the leakage current barrier 130 is not made of only the above-mentioned material.

The electrode part 140 may include a Schottky electrode 142 and an ohmic electrode 144 disposed on the epitaxial growth layer 120. The Schottky electrode 142 may be disposed at a central area a of the second nitride layer 124 and the ohmic electrode 144 may be disposed at an edge area b of the second nitride layer 124 while being spaced from the Schottky electrode 142 by a predetermined interval. The Schottky electrode 142 may generally have a disk shape and the ohmic electrode 144 may have a ring shape to surround the Schottky electrode 142. The Schottky electrode 142 may make a Schottky contact with the second nitride layer 124 at the central area a and the ohmic electrode 144 may make an ohmic contact with the second nitride layer 124 at the edge area b. The Schottky electrode 142 may be used as a node electrode and the ohmic electrode 144 may be used as a cathode electrode.

Meanwhile, the electrode part 140 may be configured to contact directly with the epitaxial growth layer 120. For this, the first oxide layer 132a of the leakage current barrier 130 may be configured to selectively expose the areas a and b of the epitaxial growth layer 120 where the electrode part 140 is formed. For example, the first oxide layer 132a of the leakage current barrier 130 may be limitatively disposed to only an area between the central area a and the edge area b. Therefore, the first oxide layer 132a may be disposed between the Schottky electrode 142 and the ohmic electrode 144.

As described above, the nitride based semiconductor device 100 according to the embodiment of the present invention may include the base substrate 110 and the epitaxial growth layer 120 that are formed in the heterogeneous bonding structure, and the leakage current barrier 130 for filling the defect 126 of the epitaxial growth layer 120. The leakage current layer 130 fills the defect 126 with the metal oxide layer in order to prevent the metal layer from entering the defect 126 while the electrode part 140 is formed. As a result, the nitride based semiconductor device 100 prevents current of the electrode part 140 from being leaked through the defect 126 and increases the breakdown voltage of the device so as to increase the production efficiency of the nitride based semiconductor device 100.

Further, since the leakage current barrier 130 is configured to cover a space with the Schottky electrode 142 and the ohmic electrode 144 with the epitaxial growth layer 120, the leakage current barrier 130 may be used as a surface passivation layer decreasing surface leakage current. Accordingly, the leakage current barrier 130 prevents current from being leaked due to movement of electric charges between the Schottky electrode 142 and the ohmic electrode 144 and thus, increases the breakdown voltage of the device so as to increase the production efficiency of the nitride based semiconductor device 100.

Continually, the process of manufacturing the nitride based semiconductor device according to an embodiment of the present invention will be described in detail. Herein, duplicated contents relating to the nitride based semiconductor device may be omitted or simplified.

Figure 3:
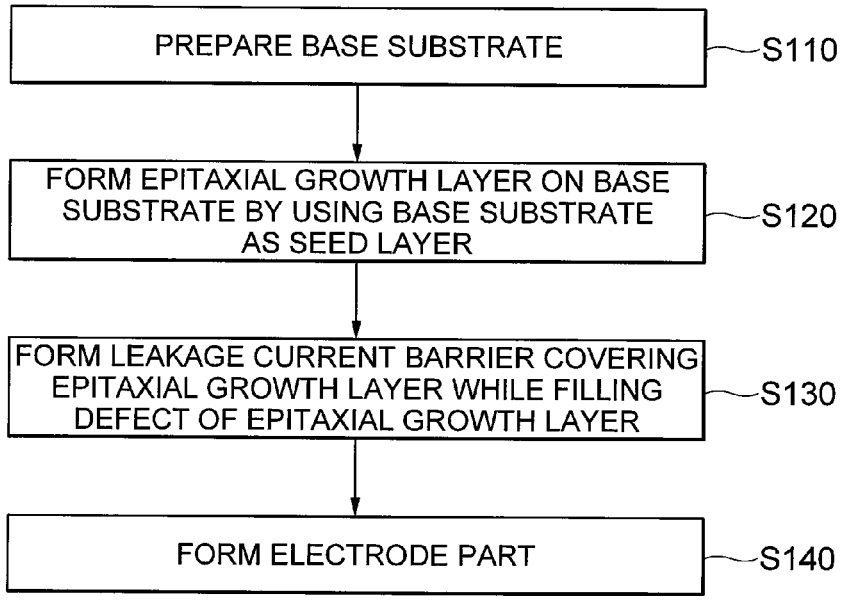
FIG. 3 is a flowchart showing diagram showing a method for manufacturing a nitride based semiconductor device according to an embodiment of the present invention.

FIG. 3 is a flowchart showing a method for manufacturing a nitride based semiconductor device according to an embodiment of the present invention. FIGS. 4 to 7 are diagrams for explaining a process of manufacturing a nitride based semiconductor device according to an embodiment of the present invention.

Figure 4:
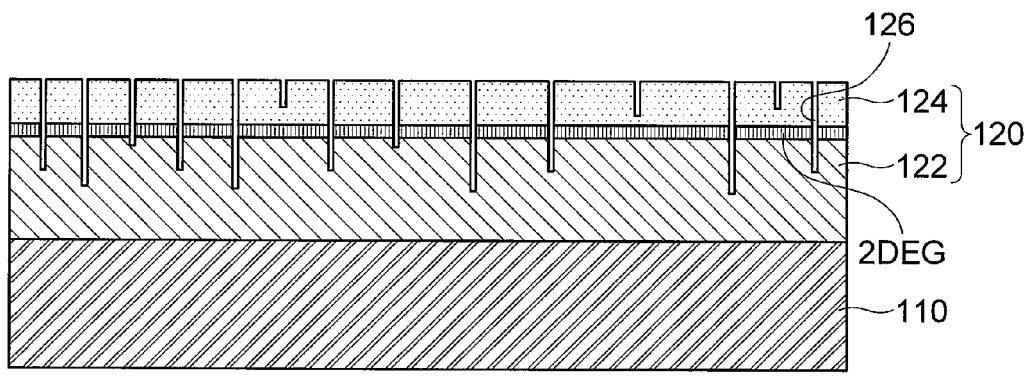
FIGS. 4 to 7 are diagrams for explaining a process of manufacturing a semiconductor device according to an embodiment of the present invention.

Referring to FIGS. 3 and 4, a base substrate 110 may be prepared (S110). Preparing the base substrate 110 may include preparing at least one substrate of a silicon substrate, a silicon carbide substrate, and a sapphire substrate.

An epitaxial growth layer 120 may be formed on the base substrate 110 by using the base substrate 110 as a seed layer (S120). Forming the epitaxial growth layer 120 may include forming a first nitride layer 122 on the base substrate 110 and forming a second nitride layer 124 on the first nitride layer 122. As one example, forming the epitaxial growth layer 120 may be performed by epitaxially growing the first nitride layer 122 by using the base substrate 110 as the seed layer and thereafter, epitaxially growing the second nitride layer 124 by using the first nitride layer 122 as the seed layer. As an epitaxial growth process for forming the first and second nitride layers 122 and 124, any one of a molecular beam epitaxial growth process, an atomic layer epitaxial growth process, a flow modulation organometallic vapor phase epitaxial growth process, an organometallic vapor phase epitaxial growth process, and a hybrid vapor phase epitaxial growth process may be used. Alternatively, as another example, as the process for forming the first and second nitride layers 122 and 124, any one of a chemical vapor deposition process and a physical vapor deposition process may be used.

Meanwhile, a defect 126 may be generated on the epitaxial growth layer 120 while the epitaxial growth layer 120 is formed. The defect 126 may generally be generated due to lattice disparity, lattice mismatch, a difference in thermal expansion coefficient, etc., between the base substrate 110 and the epitaxial growth layer 120. The defect 126 causes an empty space (void) to be generated in the epitaxial growth layer 120 and the empty space may have a structure to be exposed to the outside.

Figure 5:
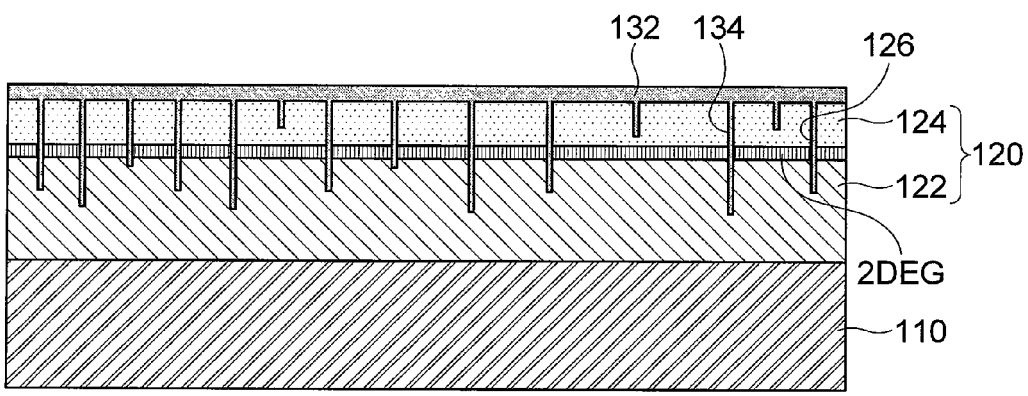

Referring to FIGS. 3 and 5, a leakage current barrier 130 for covering the epitaxial growth layer 120 while filling the defect 126 of the epitaxial growth layer 120 may be formed (S130). For example, at forming the leakage current barrier 130, forming the metal oxide layer covering the epitaxial growth layer 120 may be performed. Forming the metal oxide layer may includes forming at least one of an aluminum oxide ($Al_2O_3$) layer, a hafnium oxide ($HfO_3$) layer, a hafnium silicate oxide (HfSiO) layer, a zirconium oxide (ZnO, $ZrO_2$) layer, a titanium oxide ($TiO_2$) layer, a strontium oxide (SrO)

layer, a tantalum oxide ($Ta_2O_5$) layer, a rantannyum oxide ($La_2O_3$) layer, and a silicon oxide ($SiO_2$) layer in the epitaxial growth layer 120.

Meanwhile, the defect 126 generated in the nitride based semiconductor layer 120 due to the lattice disparity and the difference in thermal expansion coefficient has its minute gap and generally has an irregular shape. Therefore, a process having a high deposition aspect ratio may be required in order to effectively fill the defect 126 with the metal oxide. As one example to conform to the requirement, the leakage current barrier 130 may be formed by performing an atomic layer deposition (ALD). When the metal oxide layer covering the epitaxial growth layer 120 is formed by the atomic layer deposition (ALD), the metal oxide layer enters the defect 126 to be effectively filled through an opened top of the defect 126. As a result, the leakage current barrier 130 that is constituted by a first preliminary oxide layer 132 covering the second nitride layer 124 and a second oxide layer 134 that is extended from the first preliminary oxide layer 132 to fill the defect 126 may be formed on the epitaxial growth layer 120.

Figure 6:
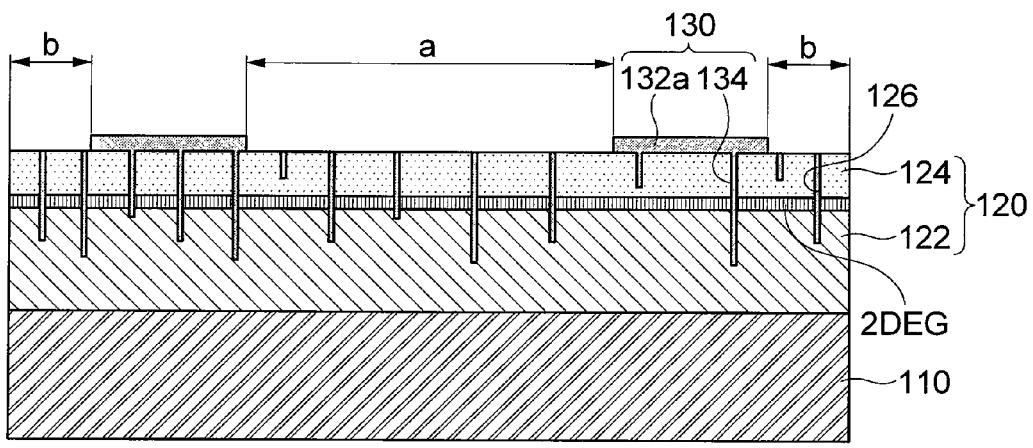
Figure 7:
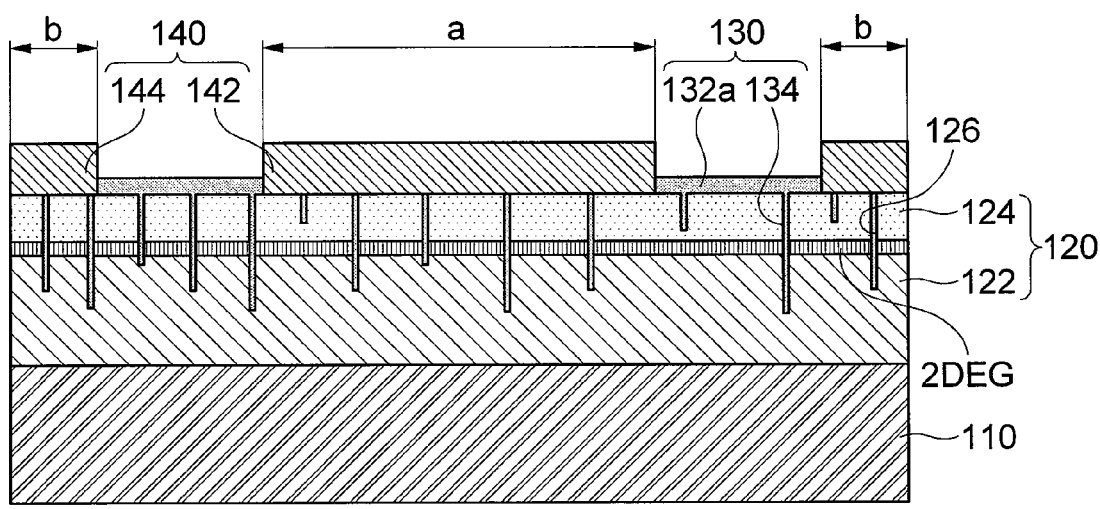

Referring to FIGS. 3, 6, and 7, an electrode part 140 may be formed (S140). For example, at forming the electrode part 140, a part of the leakage current barrier 130 described with reference to FIG. 5 may be first removed. Removing a part of the leakage current barrier 130 may be performed by processing an etching process of removing parts of the first preliminary oxide layer 132 on a central area a and an edge area b so as to expose the central area a and the edge area b of the epitaxial growth layer 120. As the etching process, a wet etching process may be used. Herein, at the etching process, an etching intensity may be adjusted so as to prevent the second oxide layer 134 for filling the defect 126 from being etched. As a result, as shown in FIG. 6, a first oxide layer 132a limitatively covering an area between the central area a and the edge area b may be formed on the epitaxial growth layer 120.

In addition, a conductive layer may be formed at the central and edge areas a and b of the epitaxial growth layer 120. Forming the conductive layer may be performed by forming the metal layer including ay one of including at least one of aluminum (Al), molybdenum (Mo), gold (Au), nickel (Ni), platinum (Pt), titanium (Ti), palladium (Pd), iridium (Ir), rhodium (Rh), cobalt (Co), tungsten (W), tantalum (Ta), copper (Cu), and zinc (Zn) on the epitaxial growth layer 120. The metal layer formed at the central area a may be used as a Schottky electrode 142 by coming in Schottky-contact with the second nitride layer 124 of the epitaxial growth layer 120. The metal layer formed at the edge area b may be used as an ohmic electrode 144 by coming in ohmic-contact with the second nitride layer 124. Meanwhile, at forming the electrode part 140, since the defect 126 of the epitaxial growth layer 120 is filled with the second oxide layer 134 of the leakage current barrier 130, the metal layer can be prevented from being formed in the defect 126.

As described above, the method for manufacturing the nitride based semiconductor device can form the leakage current barrier 130 such as the metal oxide layer in the defect 126 of the epitaxial growth layer 120 grown by using the base substrate 110 as the seed layer before forming the electrode part 140 on the epitaxial growth layer 120. As a result, the method for manufacturing a nitride based semiconductor device prevents current from being leaked from the electrode part 140 through the defect 126 by preventing the metal layer from being formed in the defect 126 at the time of forming the electrode part 140 so as to manufacture a nitride based semiconductor device capable of decreasing leakage current and increasing breakdown voltage.

Further, the method for manufacturing the nitride based semiconductor device according to the embodiment of the present invention can enable the area of the epitaxial growth layer 120 where the electrode part 140 is not formed (i.e., an area between the central and edge areas a and b) to be covered by the leakage current barrier 130. The leakage current barrier 130 may be used as the surface passivation layer decreasing the surface leakage current. In this case, the leakage current barrier 130 can prevent current from being leaked due to movement of the electrical charges between the Schottky electrode 142 and the ohmic electrode 144. Accordingly, the method for manufacturing a nitride based semiconductor device can manufacture a nitride based semiconductor device capable of decreasing the surface leakage current and increasing the breakdown voltage.

A nitride based semiconductor device according an embodiment of the present invention includes a base substrate and an epitaxial growth layer that are formed in a heterogeneous bonding structure, and a leakage current barrier filling defects of the epitaxial growth layer, in which the leakage current barrier prevents a metal layer from entering the defects while an electrode part is formed by filling the defects with a metal oxide layer. As a result, the nitride based semiconductor device prevents current of the electrode part from being leaked through the defects and increases the breakdown voltage of the device so as to improve the production efficiency of the nitride based semiconductor device.

A method for manufacturing a nitride based semiconductor device according to an embodiment of the present invention can form a metal oxide layer in the defects of the epitaxial growth layer grown by using the base substrate as a seed layer before forming the electrode part on the epitaxial growth layer. As a result, the method for manufacturing a nitride based semiconductor device prevents current from being leaked from the electrode part through the defects by preventing a metal layer from being formed due to the defects at the time of forming the electrode part so as to manufacture a nitride based semiconductor device capable of decreasing leakage current and increasing breakdown voltage.

In the method for manufacturing a nitride based semiconductor device according to the embodiment of the present invention, an area of the epitaxial growth layer where the electrode part is not formed may be covered by the leakage current barrier. The leakage current barrier may be used as a surface passivation layer decreasing surface leakage current. Accordingly, the method for manufacturing a nitride based semiconductor device can manufacture a nitride based semiconductor device capable of decreasing the surface leakage current and increasing the breakdown voltage.

The above detailed description exemplifies the present invention. Further, the above contents just illustrate and describe preferred embodiments of the present invention and the present invention can be used under various combinations, changes, and environments. That is, it will be appreciated by those skilled in the art that substitutions, modifications and changes may be made in these embodiments without departing from the principles and spirit of the general inventive concept, the scope of which is defined in the appended claims and their equivalents. Although the exemplary embodiments of the present invention have been disclosed for illustrative purposes, those skilled in the art will appreciate that various modifications, additions and substitutions are possible, without departing from the scope and spirit of the invention as disclosed in the accompanying claims. Therefore, the detailed description of the present invention does not intend to limit the present invention to the disclosed embodiments. Further, the appended claims should be appreciated as a step including even another embodiment.

What is claimed is:

1. A nitride based semiconductor device, comprising:
a base substrate;
an epitaxial growth layer disposed on the base substrate and having a defect generated due to a lattice disparity with the base substrate;
a leakage current barrier covering the epitaxial growth layer while filling the defect; and
an electrode part disposed on the epitaxial growth layer, wherein
the leakage current barrier includes:
a first oxide layer covering the epitaxial growth layer; and
a second oxide layer filling the defect, and
the electrode part includes a Schottky electrode and an ohmic electrode disposed on the epitaxial growth layer, wherein the defect is located under the Schottky electrode and the second oxide layer filling the defect under the Schottky electrode prevents a metal layer of the Schottky electrode from entering the defect to prevent a current from being leaked from the metal layer through the defect.

2. The nitride based semiconductor device according to claim 1, wherein the leakage current barrier includes any one metal oxide layer of an aluminum oxide ($Al_2O_3$) layer, a hafnium oxide ($HfO_3$) layer, a hafnium silicate oxide (HfSiO) layer, a zirconium oxide (ZnO, $ZrO_2$) layer, a titanium oxide ($TiO_2$) layer, a strontium oxide (SrO) layer, a tantalum oxide ($Ta_2O_5$) layer, a rantannyum oxide ($La_2O_3$) layer, and a silicon oxide ($SiO_2$) layer.

3. The nitride based semiconductor device according to claim 1, wherein the epitaxial growth layer includes:
a first nitride layer on the base substrate; and
a second nitride layer disposed on the first nitride layer and having an energy band gap wider than an energy band gap of the first nitride layer,
wherein a 2-dimensional electron gas (2-DEG) is generated at an interface between the first nitride layer and the second nitride layer.

4. The nitride based semiconductor device according to claim 1, wherein the Schottky electrode has a plate shape covered by the leakage current barrier at a central area of the epitaxial growth layer and the ohmic electrode has a ring shape covering the leakage current barrier at an edge area of the epitaxial growth layer.

5. The nitride based semiconductor device according to claim 1, wherein the first oxide layer is disposed between the Schottky electrode and the ohmic electrode as a surface passivation layer decreasing a leakage current of a surface of the epitaxial growth layer.

6. A method for manufacturing a nitride based semiconductor device, comprising:
preparing a base substrate;
forming an epitaxial growth layer on the base substrate by using the base substrate as a seed layer;
forming a leakage current barrier covering the epitaxial growth layer while filling a defect of the epitaxial growth layer; and
forming an electrode part on the epitaxial growth layer.

7. The method for manufacturing a nitride based semiconductor device according to claim 6, wherein the forming the leakage current barrier forms at least one metal oxide layer of an aluminum oxide ($Al_2O_3$) layer, a hafnium oxide ($HfO_3$) layer, a hafnium silicate oxide (HfSiO) layer, a zirconium oxide (ZnO, $ZrO_2$) layer, a titanium oxide ($TiO_2$) layer, a strontium oxide (SrO) layer, a tantalum oxide ($Ta_2O_5$) layer, a rantannyum oxide ($La_2O_3$) layer, and a silicon oxide ($SiO_2$) layer.

8. The method for manufacturing a nitride based semiconductor device according to claim 6, wherein the forming the leakage current barrier includes performing an automic layer deposition (ALD) process.

9. The method for manufacturing a nitride based semiconductor device according to claim 6, wherein the forming the epitaxial growth layer includes:
growing a first nitride layer on the base substrate by using the base substrate as a seed layer; and
growing a second nitride layer having a wider energy band gap than the first nitride layer on the first nitride layer by using the first nitride layer as the seed layer,
wherein 2-dimensional electron gas (2-DEG) is generated at an interface between the first nitride layer and the second nitride layer.

10. The method for manufacturing a nitride based semiconductor device according to claim 6, wherein the forming the electrode part includes:
exposing a central area and an edge area of the epitaxial growth layer by removing a part of the leakage current barrier; and
forming a metal layer at the exposed central area and edge area.

* * * * *